United States Patent
Hu et al.

(10) Patent No.: US 7,598,535 B2
(45) Date of Patent: Oct. 6, 2009

(54) LIGHT-EMITTING DIODE ASSEMBLY AND METHOD OF FABRICATION

(75) Inventors: Tseng-Hsiang Hu, Tu-Cheng (TW); Yeu-Lih Lin, Tu-Cheng (TW); Li-Kuang Tan, Tu-Cheng (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 333 days.

(21) Appl. No.: 11/309,257

(22) Filed: Jul. 20, 2006

(65) Prior Publication Data
US 2007/0132092 A1     Jun. 14, 2007

(30) Foreign Application Priority Data
Dec. 9, 2005   (CN)   ................ 2005 1 0102312

(51) Int. Cl.
*H01L 29/22* (2006.01)
*H01L 33/00* (2006.01)
*H01L 29/227* (2006.01)
*H01L 23/495* (2006.01)
*H01L 23/10* (2006.01)
*H01L 23/34* (2006.01)

(52) U.S. Cl. .................. 257/99; 257/98; 257/675; 257/706; 257/707; 257/712; 257/930; 257/E23.051; 257/E23.08; 257/E23.113; 257/E25.025; 257/E25.032; 257/E31.131; 257/E33.001; 257/E33.054; 257/E33.075; 257/E33.077; 257/E51.018; 257/E51.022

(58) Field of Classification Search ............. 257/98–99, 257/675, 706–707, 712, 930, E23.051, E23.08, 257/E23.113, E25.028, E25.032, E31.131, 257/E33.001, E33.054, E33.075, E33.077, 257/E51.018, E51.022
See application file for complete search history.

(56) References Cited

U.S. PATENT DOCUMENTS

| | | | | |
|---|---|---|---|---|
| 4,103,321 | A * | 7/1978 | Gansert et al. | 361/711 |
| 5,394,490 | A * | 2/1995 | Kato et al. | 385/14 |
| 5,436,997 | A * | 7/1995 | Makiuchi et al. | 385/92 |
| 5,675,685 | A * | 10/1997 | Fukuda et al. | 385/89 |
| 6,045,240 | A * | 4/2000 | Hochstein | 362/294 |
| 6,441,943 | B1 * | 8/2002 | Roberts et al. | 359/267 |
| 6,517,218 | B2 * | 2/2003 | Hochstein | 362/294 |
| 6,541,800 | B2 * | 4/2003 | Barnett et al. | 257/98 |
| 6,756,905 | B2 * | 6/2004 | Rattman et al. | 340/630 |
| 6,787,999 | B2 * | 9/2004 | Stimac et al. | 315/51 |
| 6,799,864 | B2 * | 10/2004 | Bohler et al. | 362/236 |
| 6,896,392 | B2 * | 5/2005 | Jigamian et al. | 362/202 |
| 7,121,680 | B2 * | 10/2006 | Galli | 362/202 |
| 7,128,454 | B2 * | 10/2006 | Kim et al. | 362/507 |
| 7,196,459 | B2 * | 3/2007 | Morris | 313/46 |
| 2004/0066142 | A1 * | 4/2004 | Stimac et al. | 315/50 |
| 2004/0190285 | A1 | 9/2004 | Galli | |
| 2006/0291206 | A1 * | 12/2006 | Angelini et al. | 362/244 |
| 2007/0158671 | A1 * | 7/2007 | Yoneda et al. | 257/99 |
| 2008/0130308 | A1 * | 6/2008 | Behr et al. | 362/507 |

* cited by examiner

*Primary Examiner*—Ida M Soward
(74) *Attorney, Agent, or Firm*—Frank R. Niranjan

(57) ABSTRACT

An LED assembly includes a packaged LED module (30) and a heat dissipation device (50). The LED module includes at least an LED die therein and a plurality of conductive pins (32, 34) extending downwardly from a bottom portion thereof. The heat dissipation device is thermally and electrically connected with the at least an LED die. The heat dissipation device defines at least a mounting hole (542) therein. At least one of the conductive pins is fittingly received in the at least a mounting hole and thermally and electrically connects with the heat dissipation device.

6 Claims, 10 Drawing Sheets

LIGHT-EMITTING DIODE ASSEMBLY AND METHOD OF FABRICATION

FIELD OF THE INVENTION

The present invention relates generally to light-emitting diode (LED) assemblies, and more particularly to an LED assembly with improved heat dissipation ability so that heat generated by the LED of the assembly can be effectively removed. The present invention relates also to a method for packaging the LED.

DESCRIPTION OF RELATED ART

Light-emitting diode (LED) is a highly efficient light source currently used widely in such field as automobile, screen display, and traffic light indication. When the LED operates to give off light, heat is accordingly produced. If not rapidly and efficiently removed, the heat produced may significantly reduce the lifespan of the LED. Therefore, a heat dissipation device is required to dissipate the heat from the LED.

FIG. 9 shows an LED module 10 in accordance with related art which has already been packaged and is ready for use. The LED module 10 includes an LED die (not visible) therein and a pair of conductive pins 14 extending laterally outwards from opposite sides thereof. The LED module 10 is mounted within a through hole 121 defined in a circuit board 12, and a flat bottom surface of the LED module 10 is maintained in thermal contact with a metal plate 13 placed under the circuit board 12. The LED die of the LED module 10 is electrically connected to the circuit board 12 via the conductive pins 14. When the LED module 10 gives off light, the LED die contained in the LED module 10 generates a large amount of heat. The heat generated by the LED die of the LED module 10 is transferred to the metal plate 13 for dissipation.

FIG. 10 is a cross-sectional view of another LED module 20 in accordance with related art after it is packaged. The LED module 20 includes an LED die 21, an outer packaging layer 22, and a pair of conductive pins 24, 25. The LED die 21, which is placed in a recess defined in the conductive pin 25, is protectively packaged and secured in place via the packaging layer 22. The conductive pins 24, 25 extend downwardly from the LED die 21, giving the LED module 20 a stand-up configuration. In this particular example, it is difficult to combine a heat dissipation device to the LED module 20 since an interference problem arises between the conductive pins 24, 25 and the heat dissipation device when combined. The heat dissipation device needs to sacrifice a large portion of its heat transfer surface area in order to accommodate and mount the conductive pins 24, 25.

Therefore, it is desirable to provide an LED assembly wherein one or more of the foregoing problems may be overcome or at least alleviated.

SUMMARY OF THE INVENTION

The present invention relates, in one aspect, to a light-emitting diode (LED) assembly. The LED assembly includes a packaged LED module and a heat dissipation device. The LED module includes at least an LED die therein and a plurality of conductive pins extending downwardly from a bottom portion thereof. The heat dissipation device is thermally and electrically connected with the at least an LED die. The heat dissipation device defines at least a mounting hole therein. At least one of the conductive pins is fittingly received in the at least a mounting hole.

The present invention relates, in another aspect, to a method for forming a light-emitting diode (LED) assembly. The method includes steps of: (A) providing a packaged LED module, wherein the LED module includes at least an LED die therein and a plurality of conductive pins extending downwardly from a bottom portion thereof; and (B) thermally and electrically connecting the at least an LED die to a heat dissipation device by inserting at least one of the conductive pins into at least a mounting hole defined in the heat dissipation device.

Other advantages and novel features of the present invention will become more apparent from the following detailed description of preferred embodiment(s) when taken in conjunction with the accompanying drawings, in which:

DETAILED DESCRIPTION OF THE INVENTION

Figure 1:
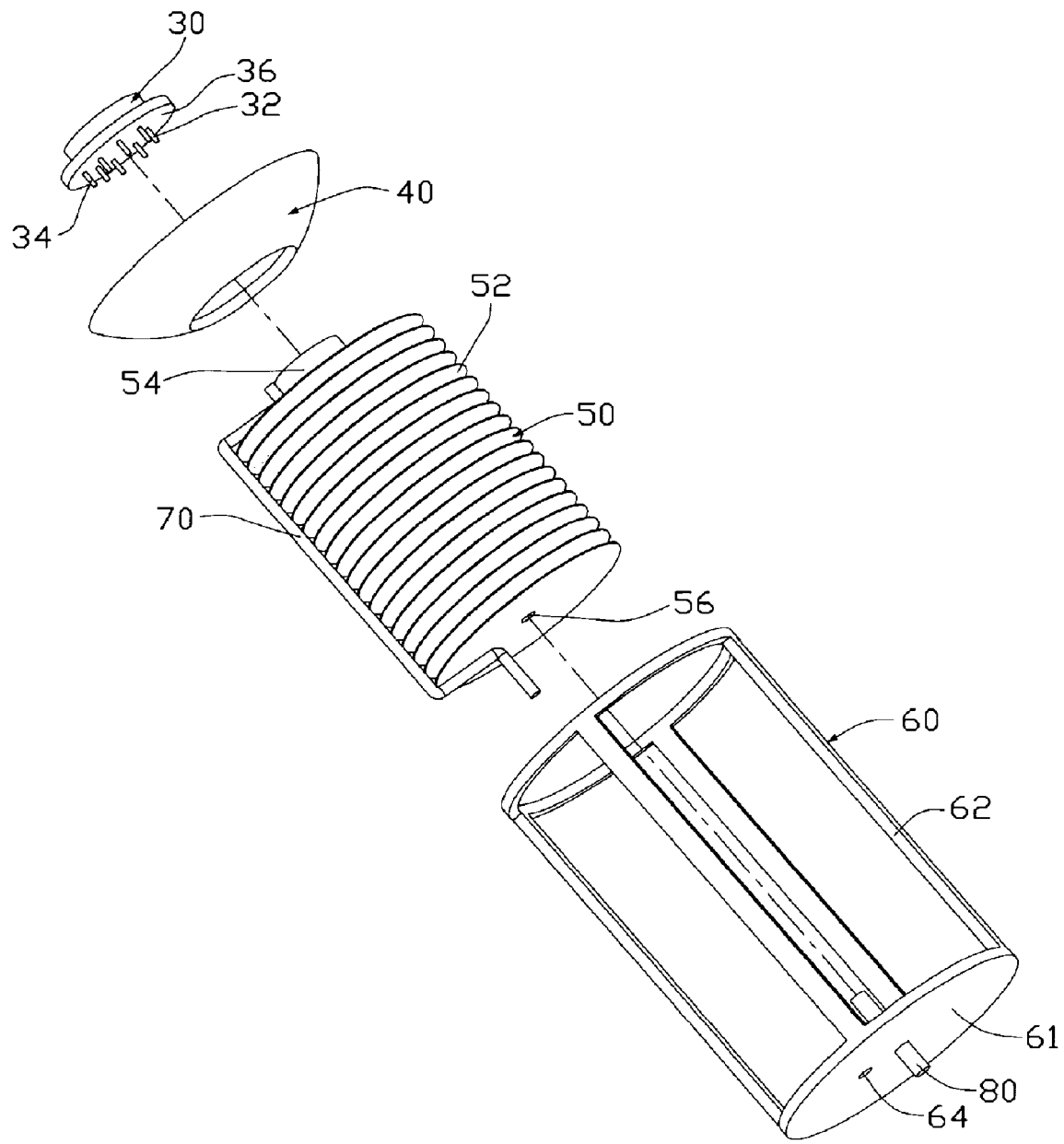
FIG. 1 is an exploded, isometric view of an LED assembly in accordance with a first embodiment of the present invention.
Figure 2:
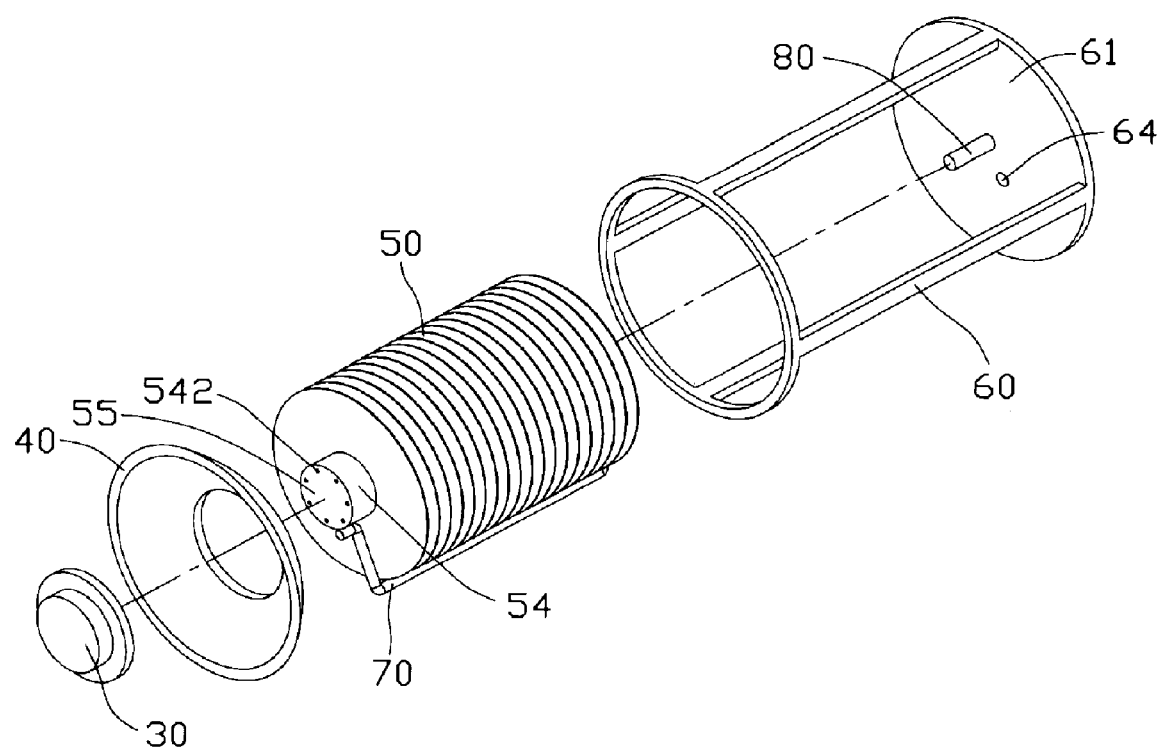
FIG. 2 is an exploded, isometric view of the LED assembly of FIG. 1, as viewed from another aspect.
Figure 3:
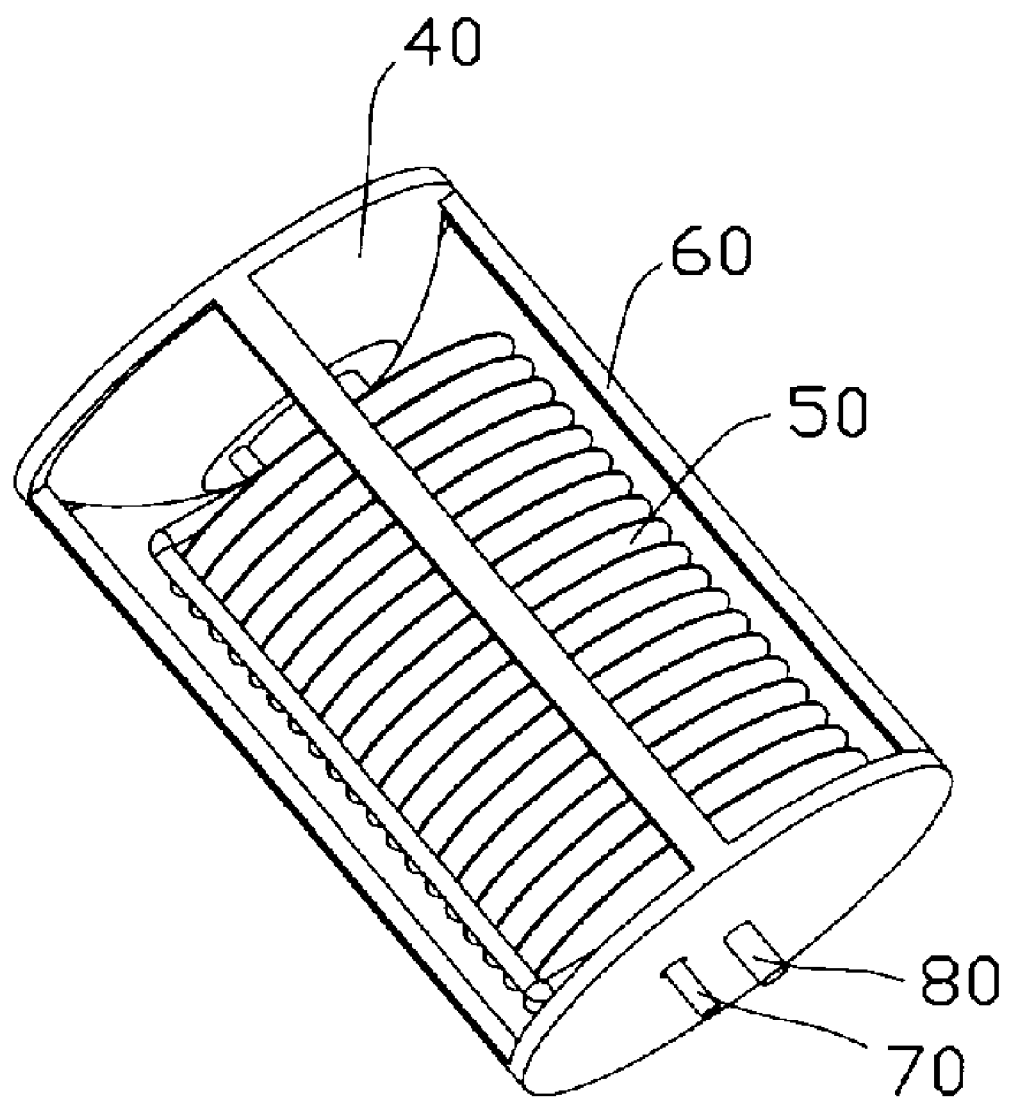
FIG. 3 is an assembled, isometric view of the LED assembly of FIG. 1.

FIGS. 1-3 illustrate an LED assembly in accordance with a first embodiment of the present invention. The LED assembly includes a packaged LED module 30, a light reflector 40, a heat dissipation device 50, a mounting frame 60, and a power source line 70.

Figure 10:
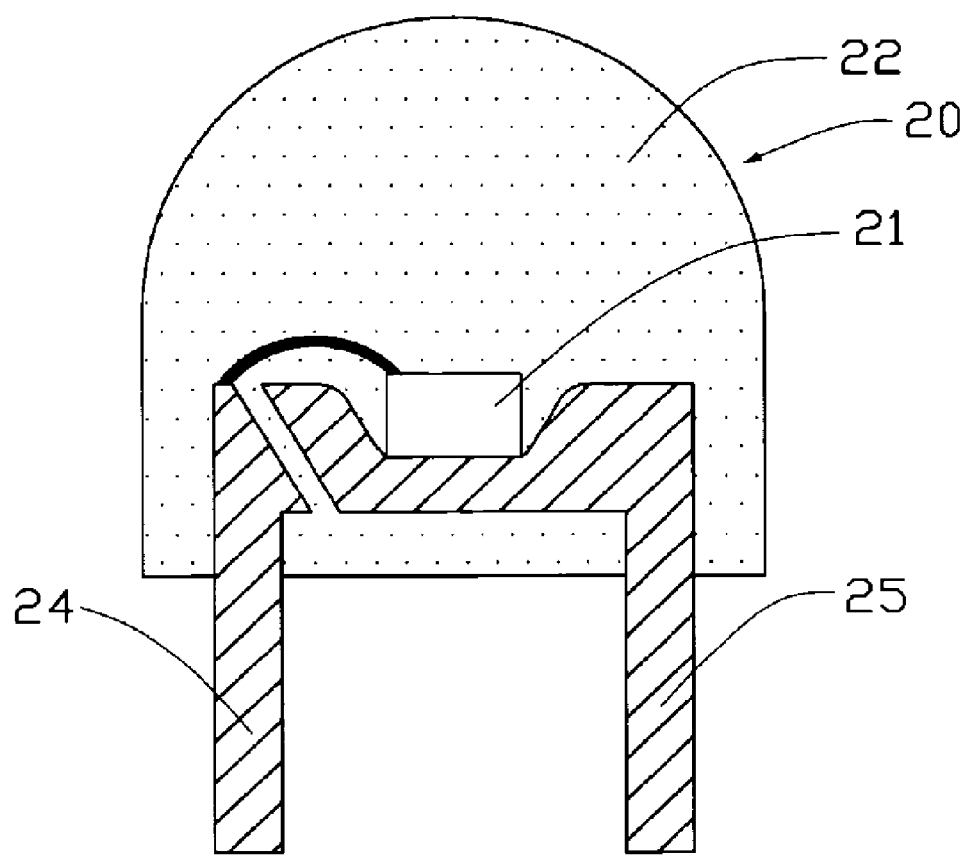
FIG. 10 is a cross-sectional view of an LED module in accordance with related art.

The LED module 30 has already been packaged into a single unit and is ready for use. As with the LED module 20 shown in FIG. 10, the LED module 30 has a stand-up configuration. The LED module 30 includes at least an LED die (not visible) therein and a plurality of conductive pins 32, 34 extending downwardly from a flat bottom surface 36 of the LED module 30. The more LED dies the LED module 30 contains, the brighter it will be when giving off light. As shown in this embodiment, the LED module 30 has eight conductive pins 32, 34; accordingly, the LED module 30 includes seven LED dies therein, wherein the conductive pin 34 functions as a common pole for being electrically connected to a positive pole (or a negative pole) of an external power source (not shown) via the power source line 70, while the other conductive pins 32 are thermally and electrically connected to the heat dissipation device 50, which in turn is electrically connected to the negative pole (or the positive pole) of the external power source.

The heat dissipation device 50 is made of highly thermally conductive material such as copper, aluminum, or their alloys. The heat dissipation device 50 as shown in this embodiment includes a central column 54 and a plurality of circular-shaped fins 52 extending laterally outwardly from an outer periphery of the column 54. The column 54 projects upwardly from the topmost fin 52 of the heat dissipation device 50 to form a protrusion 55. The protrusion 55 defines a plurality of mounting holes 542 therein for fittingly receiving the conductive pins 32 of the LED module 30. When the LED module 30 is mounted to the heat dissipation device 50, the bottom surface 36 of the LED module 30 is kept in thermal and physical contact with a top surface of the protrusion 55 to thereby increase the contacting surface area between the LED module 30 and the heat dissipation device 50. The column 54 defines a longitudinal positioning hole 56 in a bottom portion thereof.

The mounting frame 60 functions to join the LED module 30, the light reflector 40, the heat dissipation device 50 and the power source line 70 together. The mounting frame 60 includes a bottom plate 61 and a plurality of spaced ribs 62 extending upwardly from an outer peripheral edge of the bottom plate 61. An electrically conductive post 80 is fixed to the bottom plate 61. The bottom plate 61 defines a locating hole 64 therein which is spaced apart from the post 80. The post 80 includes first and second parts each located on opposing sides of the bottom plate 61 to the other. The heat dissipation device 50 and the power source line 70 are received in the mounting frame 60, as shown in FIG. 3. The light reflector 40 is located between the LED module 30 and the heat dissipation device 50. The light reflector 40 defines a central hole (not labeled) through which the protrusion 55 of the column 54 of the heat dissipation device 50 extends. The positioning hole 56 of the heat dissipation device 50 fittingly receives the first part of the post 80 therein and a free end of the power source line 70 projects outwardly from the locating hole 64 of the bottom plate 61. Thus, the positive and negative poles of the external power source can be electrically connected to the power source line 70 and the post 80, respectively, and the LED module 30 is thereby energized.

Figure 4:
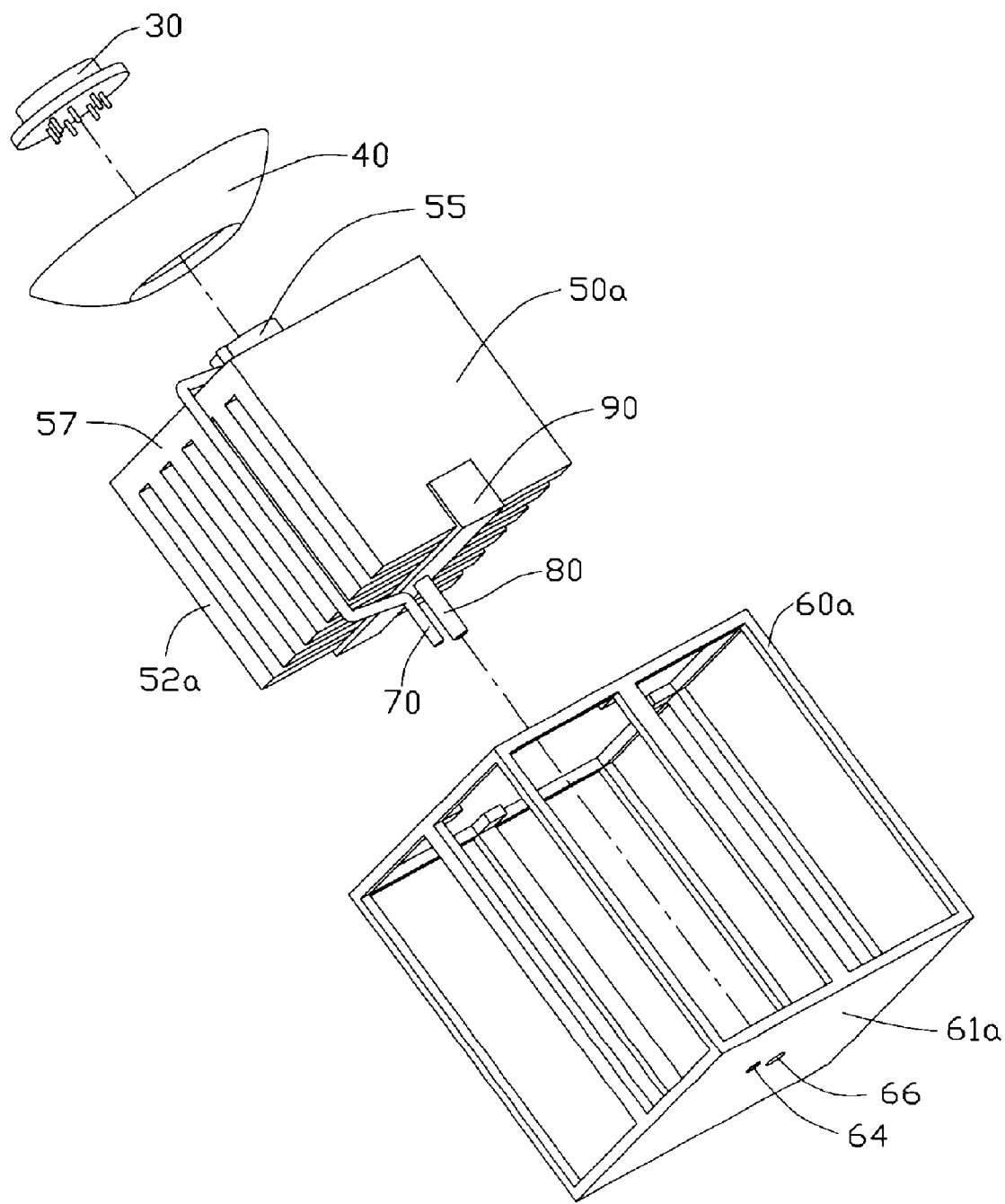
FIG. 4 is an exploded, isometric view of an LED assembly in accordance with a second embodiment of the present invention.
Figure 5:
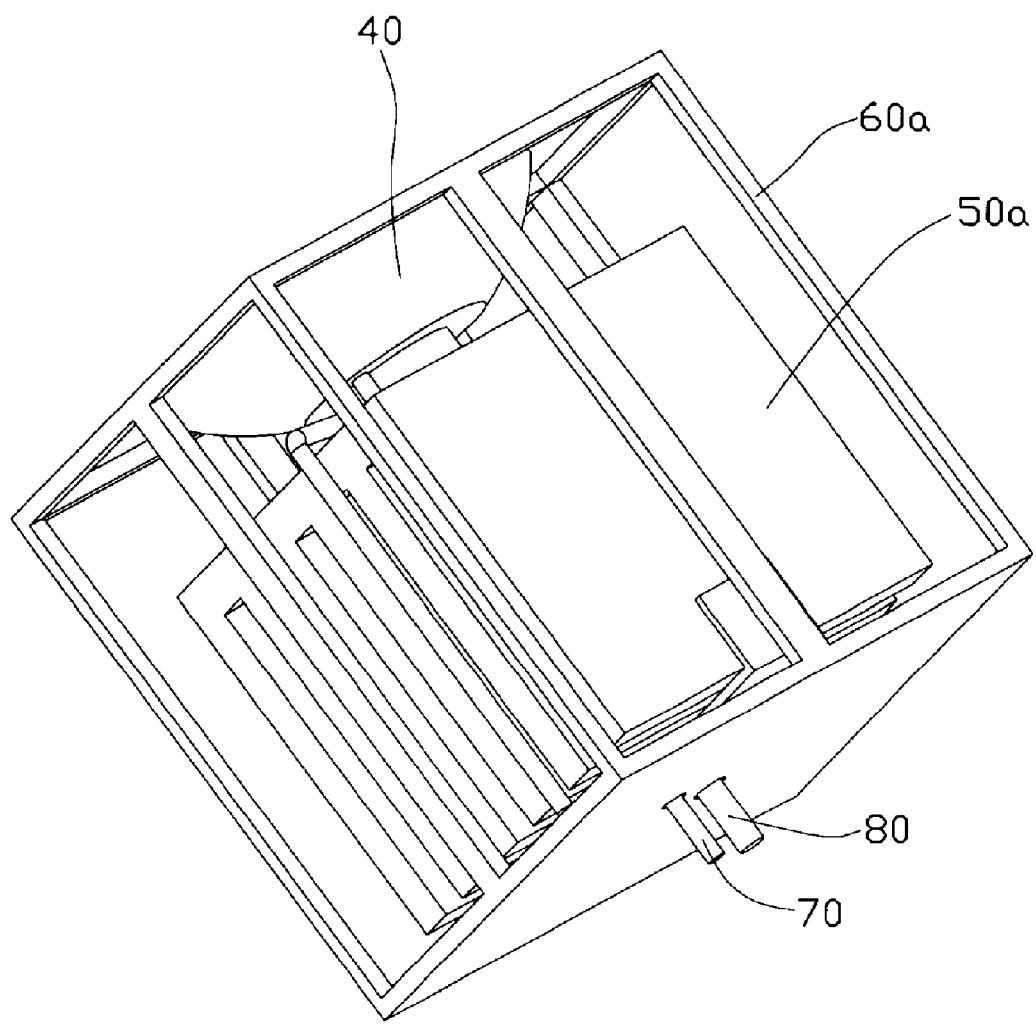
FIG. 5 is an assembled, isometric view of the LED assembly of FIG. 4.

FIGS. 4-5 illustrate a second embodiment of the present LED assembly, in which the heat dissipation device 50a includes a chassis 57 and a plurality of fins 52a extending downwardly from a surface of the chassis 57. The protrusion 55 projects upwardly from the chassis 57 in a direction opposite to the extension direction of the fins 52a. The conductive post 80 is electrically connected to the heat dissipation device 50a via a fixing device 90, which in this embodiment is shown as a U-shaped clamping plate. The bottom plate 61a of the mounting frame 60a defines a through hole 66 for extension of the post 80.

Figure 6:
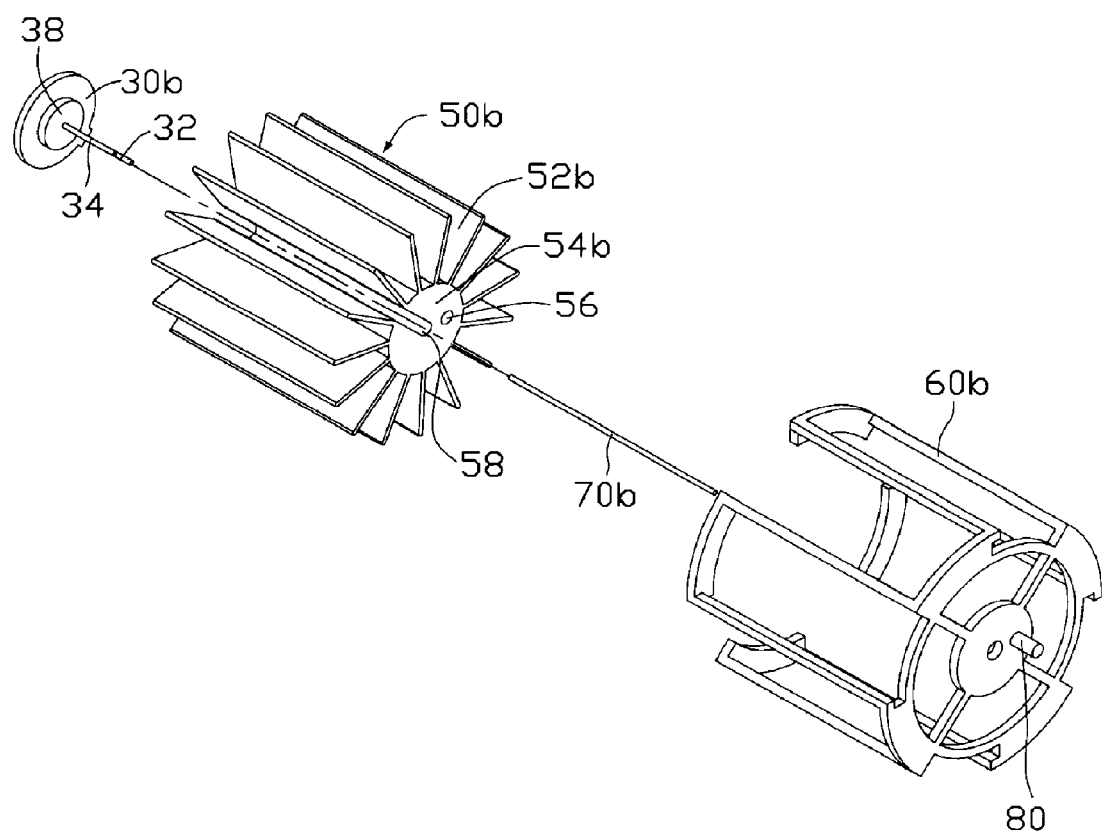
FIG. 6 is an exploded, isometric view of an LED assembly in accordance with a third embodiment of the present invention.
Figure 7:
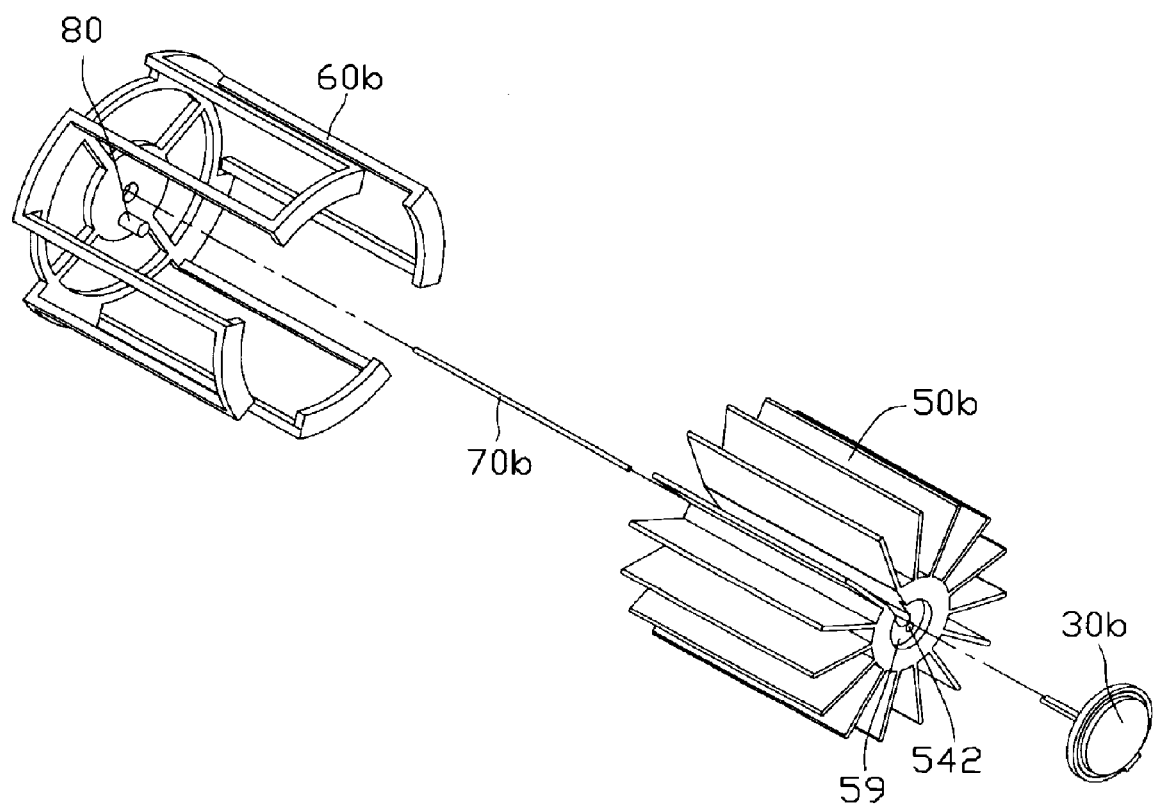
FIG. 7 is an exploded, isometric view of the LED assembly of FIG. 6, as viewed from another aspect.
Figure 8:
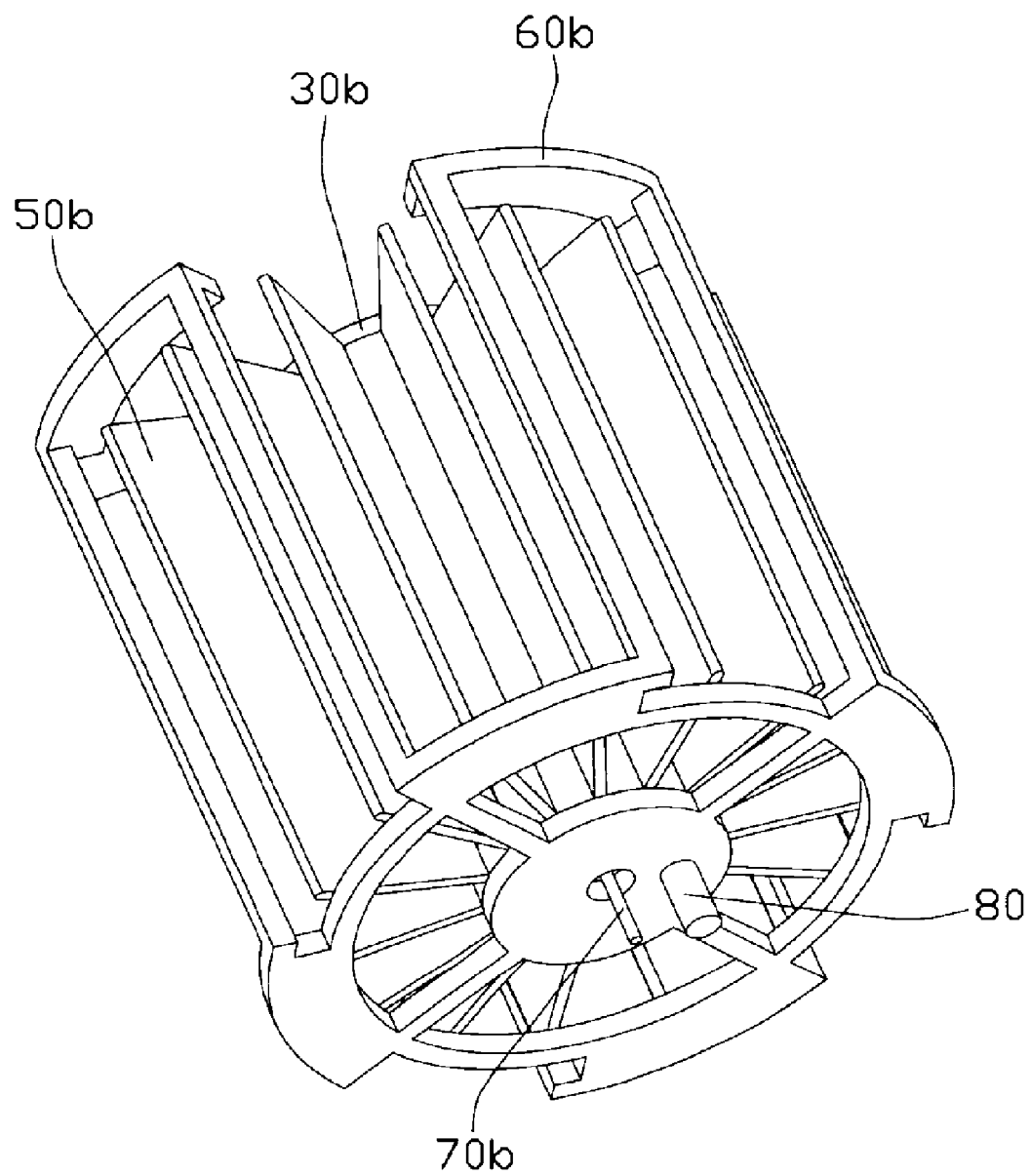
FIG. 8 is an assembled, isometric view of the LED assembly of FIG. 6.
Figure 9:
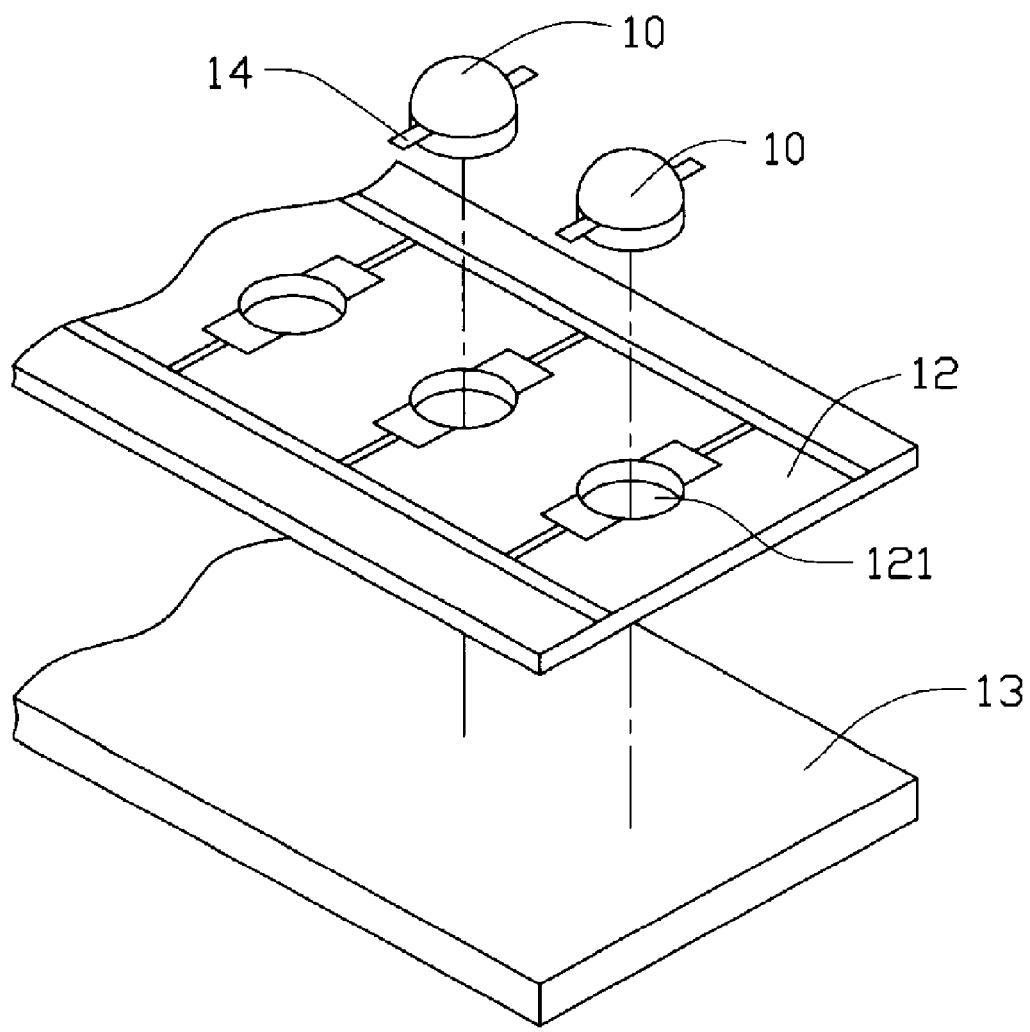
FIG. 9 is an exploded, isometric view of an LED assembly in accordance with related art.

FIGS. 6-8 illustrates a third embodiment of the present LED assembly, in which the LED module 30b has a mounting portion 38 formed at a bottom surface thereof and a pair of conductive pins 32, 34 extending downwardly from the mounting portion 38. The heat dissipation device 50b includes a central column 54b and a plurality of fins 52b extending longitudinally and radially outwardly from the column 54b. The column 54b defines a longitudinal slot 58 therein for accommodating the power source line 70b when the line 70b is electrically connected to the conductive pin 34. A top portion of the column 54b defines a recess 59 for receiving the mounting portion 38 of the LED module 30b therein, as shown in FIG. 7. Thus, the mounting portion 38 and the column 54b are thermally connected together. Heat generated by the LED module 30b can be dissipated by the heat dissipation device 50b. The column 54b defines the mounting hole 542 for receiving the conductive pine 32, and the longitudinal positioning hole 56 for receiving the electrically conductive post 80 whereby the conductive pin 32 and the conductive post 80 are electrically connected together. The conductive pin 32 and the heat dissipation device 54b are also thermally connected together thereby to help the heat transference from the LED module 30b to the heat dissipation device 50b.

According to the foregoing embodiments of the present LED assembly, the heat dissipation device 50 (50a or 50b) dissipates the heat generated by the LED module 30 (30b), and meanwhile functions to electrically energize the LED module 30 (30b) when connected between the conductive pin(s) 32 and the positive or negative pole of the external power source. Thus, the interference problem between the conductive pins and the heat dissipation device to be mounted is effectively resolved. The heat dissipation device does not have to sacrifice a large portion of its heat transfer surface area in order to accommodate and mount the conductive pins, and total heat transfer surface area and heat dissipation efficiency of the heat dissipation device is increased as a result. Furthermore, the heat dissipation device and the LED module can be assembled together via the mounting frame to form a self-contained unit for end users.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED assembly comprising:
    an LED module having at least an LED die therein and at least first and second conductive pins electrically connecting with the at least an LED die;
    a heat dissipation device made of metal and having a plurality of fins thereon, electrically and thermally connecting with the at least first conductive pin of the LED module;
    a power source line electrically connecting with the at least second conductive pin, adapted for electrically connecting the at least second conductive pin with a power source; and
    a conductive post electrically connecting with the heat dissipation device, adapted for electrically connecting the at least first conductive pin with the power source.

2. The LED assembly of claim 1, wherein the heat dissipation device has a central column and the fins are circular-shaped and extend laterally outwardly from an outer periphery of the central column.

3. The LED assembly of claim 1, wherein the heat dissipation device has an upper chassis and the fins extend downwardly from the chassis.

4. The LED assembly of claim 1, wherein the heat dissipation device has a central column and the fins extend longitudinally and radially outwardly from a periphery of the central column.

5. The LED assembly of claim 1, further comprising a mounting frame and a light reflector, wherein the heat dissipation device is received in the mounting frame, the light reflector is mounted on the heat dissipation device and the at least an LED module is mounted on the light reflector.

6. The LED assembly of claim 5, wherein the heat dissipation device has an upper protrusion extending through the light reflector, and the conductive post is fixed on a bottom plate of the mounting frame.

* * * * *

UNITED STATES PATENT AND TRADEMARK OFFICE
CERTIFICATE OF CORRECTION

PATENT NO. : 7,598,535 B2
APPLICATION NO. : 11/309257
DATED : October 6, 2009
INVENTOR(S) : Hu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 411 days.

Signed and Sealed this

Twenty-eighth Day of September, 2010

David J. Kappos
*Director of the United States Patent and Trademark Office*